(12) United States Patent
Chuang

(10) Patent No.: US 7,208,977 B2
(45) Date of Patent: Apr. 24, 2007

(54) TRISTATE STARTUP OPERATING MODE SETTING DEVICE

(75) Inventor: Shih-Jen Chuang, Hsin Chu (TW)

(73) Assignee: RDC Semiconductor Co., Ltd. (TW)

( * ) Notice: Subject to any disclaimer, the term of this patent is extended or adjusted under 35 U.S.C. 154(b) by 151 days.

(21) Appl. No.: 11/169,501

(22) Filed: Jun. 28, 2005

(65) Prior Publication Data

US 2006/0261848 A1   Nov. 23, 2006

(30) Foreign Application Priority Data

May 19, 2005   (TW) ............................... 94116233 A

(51) Int. Cl.
  *H03K 19/00*  (2006.01)
  *H03K 19/02*  (2006.01)
(52) U.S. Cl. .............................. 326/56; 326/30; 326/33
(58) Field of Classification Search ............ 326/30–31, 326/33, 56
  See application file for complete search history.

(56) References Cited

U.S. PATENT DOCUMENTS

| | | | |
|---|---|---|---|
| 5,298,800 A * | 3/1994 | Dunlop et al. ............... | 327/108 |
| 5,731,711 A * | 3/1998 | Gabara ......................... | 326/30 |
| 6,985,009 B2 * | 1/2006 | Nishio et al. ................. | 326/30 |
| 7,116,129 B2 * | 10/2006 | Pan et al. ..................... | 326/32 |

* cited by examiner

*Primary Examiner*—Rexford Barnie
*Assistant Examiner*—Jason Crawford
(74) *Attorney, Agent, or Firm*—Peter F. Corless; Steven M. Jensen; Edwards Angell Palmer & Dodge LLP

(57) ABSTRACT

A tristate operating mode setting device is proposed, which is designed for use with an electronic circuit unit for providing the electronic circuit unit with a tristate operating mode setting function, and which is characterized by the utilization of a specially-designed logic circuit and logic control signal generator to allow the electronic circuit unit to be selectively set to one of three different operating modes during startup through a connecting pad that can be externally connected in three different ways. This feature allows one single pad for the provision of three different operating mode settings, whereas prior art is only capable of providing two different settings. The electronic circuit unit is therefore able to use fewer number of pads to provide an increased number of operating mode settings, with the benefit of reducing layout space on circuit board.

5 Claims, 3 Drawing Sheets

|  | $PHIEN=1$ | $PLOEN=1$ | $NORMALEN=1$ | $PHIEN=0$, $\overline{PLOEN}=0$, $\overline{NORMALEN}=0$ |
|---|---|---|---|---|
| PAD (Pull High) | H | H | Normal O/P | Normal I/P |
| PAD (Pull Low) | L | L | Normal O/P | Normal I/P |
| PAD (NC) | H | L | Normal O/P | Normal I/P |

FIG. 3

TRISTATE STARTUP OPERATING MODE SETTING DEVICE

BACKGROUND OF THE INVENTION

1. Field of the Invention

This invention relates to electronic circuitry technology, and more particularly, to a tristate startup operating mode setting device which is designed for use in conjunction with an electronic circuit unit, such as a chip module, for providing the chip module with a tristate startup operating mode setting function that is capable of setting the chip module to a user-desired operating mode at startup by connecting an external pad in three different ways.

2. Description of Related Art

Chip modules are typically provided with one or more external pads so that the user can connect these pads in various different ways, such as connecting the pads with pull-high resistors or pull-low resistors. If the pad is connected to a pull-high resistor, it will cause the generation of a logic-HIGH signal (representative of a binary signal 1) for the chip module at startup after power-on; and whereas if the pad is connected to a pull-low resistor, it will cause the generation of a logic-LOW signal (representative of a binary signal 0) for the chip module. The generated logic-HIGH or logic-LOW signal is then used to set the chip module to a specific operating mode after power-on.

By the prior art, each pad is capable of assuming 2 output states for the operating mode setting function. Since one single pad is able to assume 2 output states for the operating mode setting function, the provision of 2 pads on the chip module will be able to assume 2*2=4 output states, the provision of 3 pads on the chip module 10 will be able to assume 2*2*2=8 output states, and so forth.

In practical applications, however, there may exist a need for 3 output states for the implementation of a tristate operating mode setting function. By the prior art, however, since each single pad can only be used to assume 2 output states, it requires the use of at least 2 pads to provide 4 output states, and from which 3 of the 4 available output states are selected for the implementation of the desired tristate operating mode setting function. One drawback to this solution, however, is that it would increase the number of pads on the chip module and therefore undesirably occupy more layout space on the circuit board.

SUMMARY OF THE INVENTION

It is therefore an objective of this invention to provide a tristate startup operating mode setting device which allows one single pad to assume 3 output states for the implementation of a tristate operating mode setting function for a chip module.

It is another objective of this invention to provide a tristate startup operating mode setting device which allows the use of fewer numbers of pads for the provision of greater numbers of output states that the prior art for implementing an operating mode setting function on a chip module without having to increase the number of pads and undesirably occupy more layout space on the circuit board.

The tristate startup operating mode setting device according to the invention is designed for use in conjunction with an electronic circuit unit, such as a chip module, for providing the chip module with a tristate startup operating mode setting function that is capable of setting the chip module to a user-desired operating mode at startup by connecting an external pad in three different ways.

The tristate startup operating mode setting device according to the invention comprises: (a) a logic control signal generating module, which is capable of generating a first logic control signal, a second logic control signal, and a third logic control signal in a predetermined sequence; (b) a first switching module, which has a first connecting end, a second connecting end, and a control signal input end, wherein the first connecting end is electrically connected to the pad, and the control signal input end is connected to receive the first logic control signal from the logic control signal generating module, and which operates in such a manner that when the received first logic control signal is at a specified logic state, the first switching module connects the first connecting end to the second connecting end; (c) a first resistive circuit, which has a first connecting end and a second connecting end, wherein the first connecting end is electrically connected to the second connecting end of the first switching module, while the second connecting end is electrically connected to a system voltage source; (d) a second switching module, which has a first connecting end, a second connecting end, and a control signal input end, wherein the first connecting end is electrically connected to both the pad and the first connecting end of the first switching module, and the control signal input end is connected to receive the second logic control signal from the logic control signal generating module, and which operates in such a manner that when the received second logic control signal is at a specified logic state, the second switching module connects the first connecting end to the second connecting end thereof; (e) a second resistive circuit, which has a first connecting end and a second connecting end, wherein the first connecting end is electrically connected to the second connecting end of the second switching module, while the second connecting end is electrically connected to a grounding node; (f) an input buffer, which has an input end and an output end, wherein the input end is connected to receive the third logic control signal from the logic control signal generating module, while the output end is electrically connected to the pad, and which is capable of buffering the received third logic control signal for outputting from the output end thereof when enabled by a triggering output signal from the chip module; and (g) an output buffer, which has an input end and an output end, wherein the input end is electrically connected to the pad, while the output end is used to generate an output signal serving as a mode setting input signal to the electronic circuit unit for setting the chip module to a specific operating mode.

The tristate startup operating mode setting device according to the invention is characterized by the utilization of a specially-designed logic circuit with a dedicated logic control signal generating module to allow three output states by means of connecting an external pad in 3 different ways, namely: (1) connection with a pull-high resistor; (2) connection with a pull-low resistor; and (3) non-connected. Since the invention is able of assuming 3 output states through one single pad, which is better than the provision of only 2 output states by the prior art, it allows the circuit designer to use less numbers of pads for providing greater numbers of output states for the implementation of an operating mode setting function on the chip module, without having to increase the number of pads and undesirably occupy more layout space on the circuit board.

BRIEF DESCRIPTION OF DRAWINGS

The invention can be more fully understood by reading the following detailed description of the preferred embodiments, with reference made to the accompanying drawings, wherein:

FIG. 3 is a table showing the relationships of the states of a mode setting input signal with respect to different pad connections and the states of three logic control signals generated by the tristate startup operating mode setting device of the invention.

DETAILED DESCRIPTION OF PREFERRED EMBODIMENTS

The tristate startup operating mode setting device according to the invention is disclosed in full details by way of preferred embodiments in the following with reference to the accompanying drawings.

Figure 1:
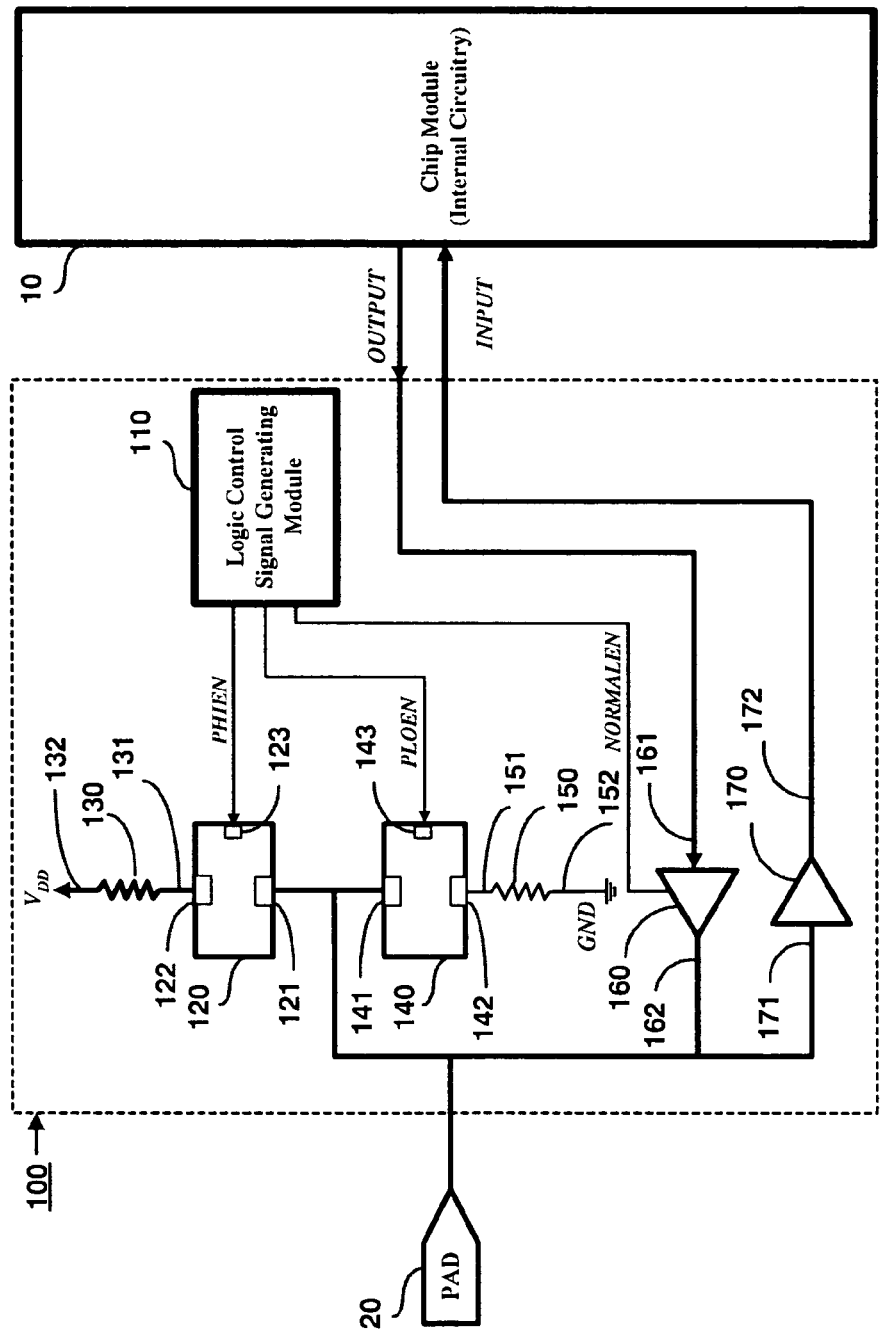
FIG. 1 is a schematic diagram showing the circuit architecture of the tristate startup operating mode setting device according to the invention.

FIG. 1 is a schematic diagram showing the application architecture and internal circuit architecture of the tristate startup operating mode setting device according to the invention (as the part enclosed in the dotted box indicated by the reference numeral 100). As shown, the tristate startup operating mode setting device of the invention 100 is designed for use in conjunction with an electronic circuit unit, such as the internal circuitry of a chip module 10, for providing the chip module 10 with a tristate startup operating mode setting function that is capable of setting the chip module to a user-desired operating mode at startup after power-on by connecting an external pad 20 in three different ways, namely: (1) connection with a pull-high resistor; (2) connection with a pull-low resistor; and (3) non-connected (NC).

As shown in FIG. 1, the internal circuit architecture of the tristate startup operating mode setting device of the invention 100 comprises: (a) a logic control signal generating module 110; (b) a first switching module 120; (c) a first resistive circuit 130; (d) a second switching module 140; (e) a second resistive circuit 150; (f) an input buffer 160; and (g) an output buffer 170. In practical implementation, for example, the tristate startup operating mode setting device of the invention 100 can be integrated to the internal circuitry of the chip module 10 with the pad 20 being exposed to the outside so that the user can connect the pad 20 either to a pull-high resistor, or to a pull-low resistor, or leave it non-connected, for the purpose of setting the chip module 10 at startup after power-on to a user-desired operating mode.

Figure 2A:
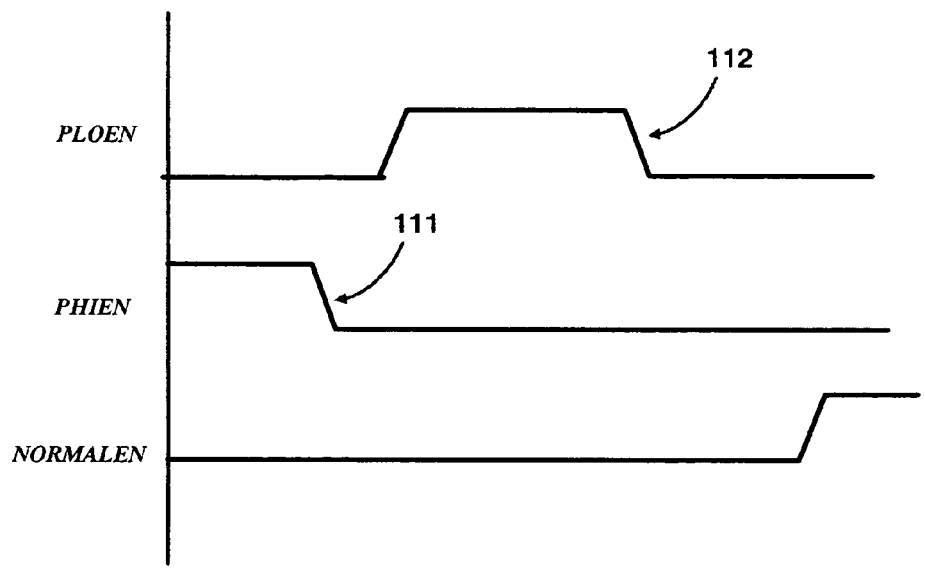
FIG. 2A is a logic signal diagram showing the waveform and sequencing of a first preferred embodiment of three logic control signals utilized by the tristate startup operating mode setting device according to the invention.
Figure 2B:
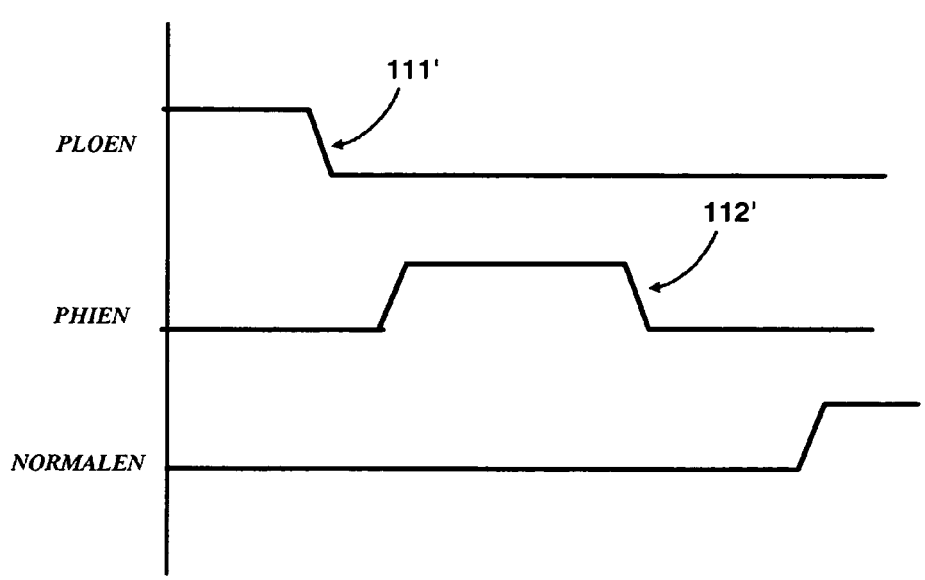
FIG. 2B is a logic signal diagram showing the waveform and sequencing of a second preferred embodiment of three logic control signals utilized by the tristate startup operating mode setting device according to the invention.

The logic control signal generating module 110 is capable of generating a first logic control signal PHIEN, a second logic control signal PLOEN, and a third logic control signal NORMALEN in a predetermined pattern of waveform and sequencing. FIG. 2A and FIG. 2B respectively show two different preferred embodiments of the waveform and sequencing of these three logic control signals PHIEN, PLOEN, and NORMALEN. In the embodiment of FIG. 2A, the first logic control signal PHIEN first appears at logic-HIGH state, the second logic control signal PLOEN appears at logic-LOW state, and the third logic control signal NORMALEN appears at logic-LOW state. Subsequently, at a high-to-low transition 111, the first logic control signal PHIEN is switched to and maintained at logic-LOW state, and after that, the second logic control signal PLOEN is switched from logic-LOW state to logic-HIGH state for a predetermined duration. Subsequently, at a high-to-low transition 112, the second logic control signal PLOEN is switched to logic-LOW state and maintained at logic-LOW state thereafter; and after that, the third logic control signal NORMALEN is switch from logic-LOW state to logic-HIGH state. The embodiment of FIG. 2B differs from that of FIG. 2A only in that the first logic control signal PHIEN and the second logic control signal PLOEN are interchanged in waveform.

The first switching module 120 has a first connecting end 121, a second connecting end 122, and a control signal input end 123, wherein the first connecting end 121 is electrically connected to the pad 20, the second connecting end 122 is electrically connected to the first resistive circuit 130, and the control signal input end 123 is connected to receive the first logic control signal PHIEN from the logic control signal generating module 110. The first switching module 120 operates in such a manner that when the received first logic control signal PHIEN is at a specified logic state (in this embodiment, a logic-HIGH state), it will connect the first connecting end 121 to the second connecting end 122, i.e., establishing an electrically-conductive path between the first connecting end 121 and the second connecting end 122.

The first resistive circuit 130 has a first connecting end 131 and a second connecting end 132, wherein the first connecting end 131 is electrically connected to the second connecting end 122 of the first switching module 120, while the second connecting end 132 is electrically connected to a system voltage source $V_{DD}$.

The second switching module 140 has a first connecting end 141, a second connecting end 142, and a control signal input end 143, wherein the first connecting end 141 is electrically connected to both the pad 20 and the first connecting end 121 of the first switching module 120, the second connecting end 142 is electrically connected to the second resistive circuit 150, and the control signal input end 143 is connected to receive the second logic control signal PLOEN from the logic control signal generating module 110. The second switching module 140 operates in such a manner that when the received second logic control signal PLOEN is at a specified logic state (in this embodiment, a logic-HIGH state), it will connect the first connecting end 141 to the second connecting end 142 thereof, i.e., establishing an electrically-conductive path between the first connecting end 141 and the second connecting end 142.

The second resistive circuit 150 has a first connecting end 151 and a second connecting end 152, wherein the first connecting end 151 is electrically connected to the second connecting end 142 of the second switching module 140, while the second connecting end 152 is electrically connected to a grounding node GND.

The input buffer 160 has an input end 161 and an output end 162, wherein the input end 161 is connected to receive the third logic control signal NORMALEN from the logic control signal generating module 110, while the output end 162 is electrically connected to the pad. The input buffer 160 operates in such a manner that when it receives a triggering output signal OUTPUT from the chip module 10 (the triggering output signal OUTPUT is generated when electrical power is supplied to the internal circuitry of the chip module 10 during power-on), it will be enabled to buffer the received third logic control signal NORMALEN for outputting from the output end 162 thereof.

The output buffer 170 has an input end 171 and an output end 172, wherein the input end 171 is electrically connected to the pad 20, while the output end 172 is connected to the chip module 10 and used to generate an output signal serving as a mode setting input signal INPUT to the chip module 10. The state of the mode setting input signal INPUT determines which operating mode is selected for the chip module 10 to operate at startup after power-on.

In practical application, the tristate startup operating mode setting device of the invention 100 is capable of setting the chip module 10 to a desired operating mode which is determined by the mode setting input signal INPUT by connecting the pad 20 in three different ways, namely: (1) connection with a pull-high resistor; (2) connection with a pull-low resistor; and (3) non-connected (NC). The mode setting input signal INPUT is transferred to the internal circuitry of the chip module 10 and used to enable the chip module 10 to operate in the user-selected operating mode after power-on.

FIG. 3 shows the relationships of the states of the mode setting input signal INPUT with respect to different pad connections and the states of the logic control signals [PHIEN, PLOEN, NORMALEN]. As shown, if the pad 20 is connected to a pull-high resistor, the mode setting input signal INPUT will be a logic-HIGH state (H) when PHIEN=1, a logic-HIGH state (H) when PLOEN=1, used to set the chip module 10 to normal output mode (Normal O/P) when NORMALEN=1, and used to set the chip module 10 to normal input mode (Normal I/P) when [PHIEN, PLOEN, NORMALEN]=[0, 0, 0]. On the other hand, if the pad 20 is connected to a pull-low resistor, the mode setting input signal INPUT will be a logic-LOW state (L) when PHIEN=1, a logic-LOW state (L) when PLOEN=1, used to set the chip module 10 to normal output mode (Normal O/P) when NROMLEN=1, and used to set the chip module 10 to normal input mode (Normal I/P) when [PHIEN, PLOEN, NORMALEN]=[0, 0, 0]. Further, if the pad 20 is non-connected (NC), the mode setting input signal INPUT will be a logic-HIGH state (H) when PHIEN=1, a logic-LOW state (L) when PLOEN=1, used to set the chip module 10 to normal output mode (Normal O/P) when NROMLEN=1, and used to set the chip module 10 to normal input mode (Normal I/P) when [PHIEN, PLOEN, NORMALEN]=[0, 0, 0].

Further, as illustrated in FIG. 2A, when the logic control signal PHIEN is switched from logic-HIGH state to logic-LOW state at the high-to-low transition 111, it will cause the current state of the mode setting input signal INPUT to be latched; and in a subsequent temporal point when PLOEN is switched from logic-HIGH state to logic-LOW state at the high-to-low transition 112, it will also cause the current state of the mode setting input signal INPUT to be latched. Alternatively, as illustrated in FIG. 2B, the logic control signals PHIEN and PLOEN can be interchanged in waveform and sequencing, such that when the logic control signal PLOEN is switched from logic-HIGH state to logic-LOW state at the high-to-low transition 111', it will cause the current state of the mode setting input signal INPUT to be latched; and in a subsequent temporal point when PHIEN is switched from logic-HIGH state to logic-LOW state at the high-to-low transition 112', it will also cause the current state of the mode setting input signal INPUT to be latched. Both the embodiments of FIG. 2A and FIG. 2B can achieve the same end result.

Consequently, as described above, the tristate startup operating mode setting device of the invention 100 is capable of setting the chip module 10 to a user-desired operating mode by way of three different external connections to the pad 20. By the invention, since one single pad is able to assume 3 output states for the operating mode setting function, the provision of two pads on the chip module 10 will be able to assume 3*3=9 output states, the provision of three pads on the chip module 10 will be able to assume 3*3*3=27 output states, and so forth.

In conclusion, the invention provides a tristate startup operating mode setting device for use with an electronic circuit unit, such as a chip module, for providing the chip module with a tristate startup operating mode setting function; and which is characterized by the utilization of a specially-designed logic circuit with a dedicated logic control signal generating module to allow three output states by means of connecting an external pad in 3 different ways, namely: (1) connection with a pull-high resistor; (2) connection with a pull-low resistor; and (3) non-connected. Since the invention is able of assuming 3 output states through one single pad, which is better than the provision of only 2 output states by the prior art, it allows the circuit designer to use less numbers of pads for providing greater numbers of output states for the implementation of an operating mode setting function on the chip module, without having to increase the number of pads and undesirably occupy more layout space on the circuit board. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A tristate startup operating mode setting device for providing an electronic circuit unit with a tristate startup operating mode setting function;

the tristate startup operating mode setting device comprising:

a logic control signal generating module, which is capable of generating a first logic control signal, a second logic control signal, and a third logic control signal in a predetermined pattern of waveform and sequencing;

a first switching module, which has a first connecting end, a second connecting end, and a control signal input end, wherein the first connecting end is electrically connected to a pad, and the control signal input end is connected to receive the first logic control signal from the logic control signal generating module, and which operates in such a manner that when the received first logic control signal is at a specified logic state, the first switching module connects the first connecting end to the second connecting end;

a first resistive circuit, which has a first connecting end and a second connecting end, wherein the first connecting end is electrically connected to the second connecting end of the first switching module, while the second connecting end is electrically connected to a system voltage source;

a second switching module, which has a first connecting end, a second connecting end, and a control signal input end, wherein the first connecting end is electrically connected to both the pad and the first connecting end of the first switching module, and the control signal input end is connected to receive the second logic control signal from the logic control signal generating module, and which operates in such a manner that when the received second logic control signal is at a specified logic state, the second switching module connects the first connecting end to the second connecting end thereof;

a second resistive circuit, which has a first connecting end and a second connecting end, wherein the first connecting end is electrically connected to the second connecting end of the second switching module, while the second connecting end is electrically connected to a grounding node;

an input buffer, which has an input end and an output end, wherein the input end is connected to receive the third logic control signal from the logic control signal generating module, while the output end is electrically connected to the pad, and which is capable of buffering the received third logic control signal for outputting from the output end thereof when enabled by a triggering output signal from the chip module; and an output buffer, which has an input end and an output end, wherein the input end is electrically connected to the pad, while the output end is used to generate an output signal serving as a mode setting input signal to the electronic circuit unit for setting the chip module to a specific operating mode.

2. The tristate startup operating mode setting device of claim 1, wherein the electronic circuit unit is a chip module.

3. The tristate startup operating mode setting device of claim 1, wherein the pad is connectable in three ways, including connection with a pull-high resistor, connection with a pull-low resistor, and non-connected, to provide 3 different output states for implementing the operating mode setting function.

4. The tristate startup operating mode setting device of claim 1, wherein the first logic control signal first appears at logic-HIGH state, the second logic control signal appears at logic-LOW state, and the third logic control signal appears at logic-LOW state; and subsequently, at a high-to-low transition, the first logic control signal is switched to and maintained at logic-LOW state for latching the mode setting input signal from the output buffer, and after that, the second logic control signal is switched from logic-LOW state to logic-HIGH state for a predetermined duration; and subsequently, at a high-to-low transition, the second logic control signal is switched to logic-LOW state and maintained at logic-LOW state for latching the mode setting input signal from the output buffer; and after that, the third logic control signal is switch from logic-LOW state to logic-HIGH state.

5. The tristate startup operating mode setting device of claim 1, wherein second logic control signal first appears at logic-HIGH state, the first logic control signal appears at logic-LOW state, and the third logic control signal appears at logic-LOW state; and subsequently, at a high-to-low transition, the second logic control signal is switched to and maintained at logic-LOW state for latching the mode setting input signal from the output buffer, and after that, the first logic control signal is switched from logic-LOW state to logic-HIGH state for a predetermined duration; and subsequently, at a high-to-low transition, the first logic control signal is switched to logic-LOW state and maintained at logic-LOW state for latching the mode setting input signal from the output buffer; and after that, the third logic control signal is switch from logic-LOW state to logic-HIGH state.

* * * * *